United States Patent [19]

Kawai et al.

[11] 4,069,434
[45] Jan. 17, 1978

[54] QUARTZ CRYSTAL OSCILLATOR

[75] Inventors: Masanori Kawai, Tatsuno; Shinkichi Kobayashi, Chino, both of Japan

[73] Assignee: Kabushiki Kaisha Suwa Seikosha, Tokyo, Japan

[21] Appl. No.: 749,552

[22] Filed: Dec. 10, 1976

Related U.S. Application Data

[63] Continuation of Ser. No. 537,030, Dec. 27, 1974, abandoned.

[51] Int. Cl.² ............................................. H01L 41/04
[52] U.S. Cl. ..................................... 310/348; 310/370
[58] Field of Search ................. 310/8.2, 8.5, 8.6, 9.1, 310/9.4, 25; 58/23 TF

[56] References Cited
U.S. PATENT DOCUMENTS

| | | | |
|---|---|---|---|
| 3,909,639 | 9/1975 | Kawai et al. | 310/9.1 |
| 3,909,640 | 9/1975 | Kawai | 310/9.1 |

Primary Examiner—Mark O. Budd
Attorney, Agent, or Firm—Blum, Moscovitz, Friedman & Kaplan

[57] ABSTRACT

A hermetically sealed quartz crystal vibrator assembly having a flexible mounting plate for mounting a flexural mode quartz crystal vibrator adapted to vibrate in a first vibratory direction on a reference member. The mounting plate includes a first portion for supporting the vibrator and a second portion for coupling to the reference member. The mounting plate further includes a resilient portion between the first and second portions, the resilient portion being adapted to vibrate in the first vibratory direction and to further vibrate in a vibratory direction defining an angle of about 90° with respect to the first vibratory direction. The resilient portion of the plate includes a stepwise bend to thereby define a gap between the vibrator and the resilient portion of the mounting plate overlapping the vibrator.

11 Claims, 7 Drawing Figures

QUARTZ CRYSTAL OSCILLATOR

This is a continuation of application Ser. No. 537,030, filed Dec. 27, 1974 now abandoned.

BACKGROUND OF THE INVENTION

This invention is directed to an improved hermetically sealed quartz crystal vibrator assembly and in particular to a mounting plate for mounting a flexural mode quartz crystal vibrator in a hermetically sealed vibrator assembly to render same particularly suitable for use in oscillator circuits adapted to produce high frequency time standard signals for electronic timepieces.

Heretofore, hermetically sealed flexural mode quartz crystal vibrator assemblies have taken on various forms, the most popular of which are the suspension of a tuning fork vibrator by suspension wires or the plating of electrodes on a quartz crystal vibrator plate, the plate being mounted to a reference member. Because of the difficulty in effectively mounting both types of vibrators to allow same to vibrate without being affected by shocks, etc., the time and expense required to manufacture such quartz crystal vibrator assemblies is less than completely satisfactory.

SUMMARY OF THE INVENTION

Generally speaking, in accordance with the invention, a mounting plate for a hermetically sealed flexural mode quartz crystal vibrator is provided. The flexural mode quartz crystal vibrator is adapted to vibrate in a first vibratory direction. A mounting plate having a first portion supporting the vibrator and a second portion secured to a reference member. The mounting plate further includes a resilient portion between the first and second portions, the resilient portion being adapted to vibrate in the first vibratory direction and to further vibrate in a vibratory direction defining an angle of about 90° with respect to the first vibratory direction. The resilient portion of the plate includes a stepwise bend to define a gap between the vibrator and the resilient portion of the plate overlapping the vibrator.

Accordingly, it is an object of this invention to provide an improved hermetically sealed quartz crystal vibrator assembly wherein the Q value remains stable in response to external shocks applied to the assembly.

Another object of this invention is to provide a hermetically sealed quartz crystal vibrator assembly having a resilient mounting plate for resiliently mounting a quartz crystal vibrator in a hermetically sealed assembly.

Still another object of this invention is to provide a flexible mounting plate which enables a hermetically sealed quartz crystal vibrator assembly to be reduced in size and the manufacturing thereof facilitated thereby.

Still another object of this invention is to provide a hermetically sealed quartz crystal vibrator assembly having a resilient lead plate for providing electrical connection between the vibrator electrodes and the hermetical terminals.

Still other objects and advantages of the invention will in part be obvious and will in part be apparent from the specification.

The invention accordingly comprises the features of construction, combination of elements and arrangement of parts which will be exemplified in the construction hereinafter set forth and the scope of the invention will be indicated in the claims.

BRIEF DESCRIPTION OF THE DRAWINGS

For a fuller understanding of the invention, reference is had to the following description taken in connection with the accompanying drawings in which.

DETAILED DESCRIPTION OF THE PREFERRED EMBODIMENTS

Figure 1:
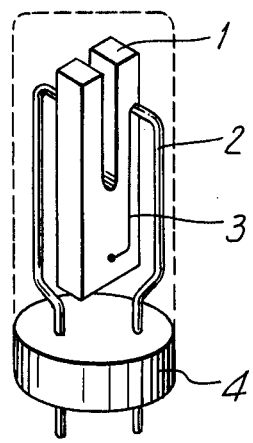
FIGS. 1 and 2 are perspective views of hermetically sealed tuning fork vibrator assemblies constructed in accordance with the prior art.

Reference is now made to FIG. 1 wherein a prior art hermetically sealed quartz crystal vibrator assembly of the type utilized in electronic timepiece oscillator circuits is depicted. The vibrator 1 is mounted to a hermetical terminal 4 by suspension wires 2 and 3, a dash line illustrating the packaging member. Such an assembly requires considerable time to manufacture because of the considerable skill required to mount the tuning fork vibrator and to obtain the desired frequency therefrom.

Figure 2:
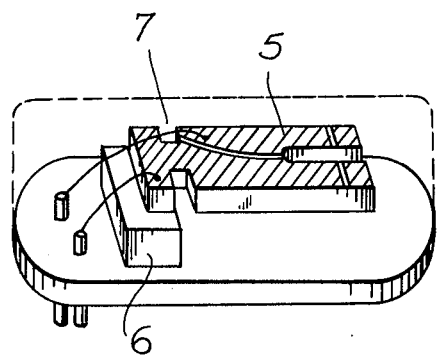

Reference is also made to FIG. 2 wherein another prior art hermetically sealed quartz crystal vibrator assembly is illustrated. A vibrator 5 is cut from a quartz crystal and is mounted to a hermetical terminal by a mounting base 6. Notches 7 are provided in the vibrator in order to minimize the vibratory effects of the vibrating portion of the vibrator 5 on the fixed portion of the vibrator mounted to mounting block 6. Nevertheless such notches cause the vibrator 5 to be physically impaired in response to shocks to the assembly. Also, like the prior art vibrator assembly illustrated in FIG. 1, the manufacturing of such an assembly is tedious, requiring many steps to form the electrodes on the surface of the vibrator and requiring considerable skill to provide a vibrator which is adapted to be tuned to vibrate at a desired frequency.

Figure 3:
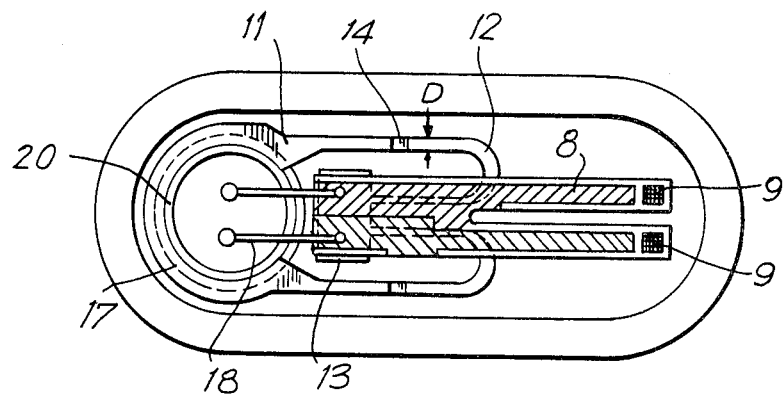
FIG. 3 is a plan view of a hermetically sealed quartz crystal vibrator assembly constructed in accordance with the instant invention, with the top lid removed.
Figure 4:
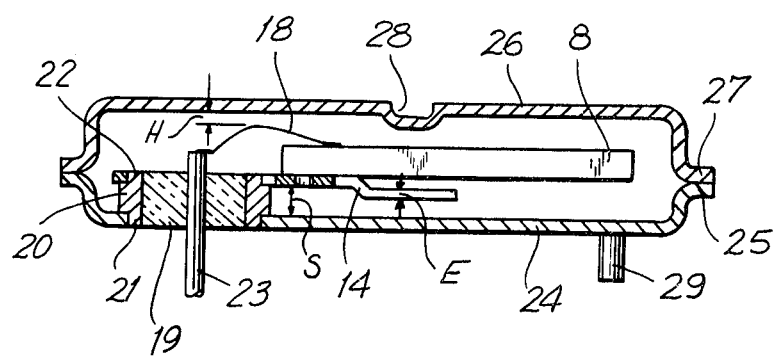
FIG. 4 is a sectional view of the hermetically sealed quartz crystal vibrator assembly illustrated in FIG. 3.
Figure 5:
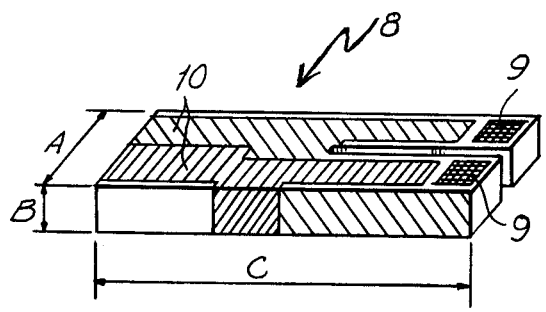
FIG. 5 is a perspective view of the tuning fork quartz crystal vibrator depicted in FIGS. 3 and 4.

Reference is now made to FIGS. 3 through 6 wherein a hermetically sealed quartz crystal vibrator assembly constructed in accordance with the instant invention is depicted. A quartz crystal vibrator 8, more particularly illustrated in FIG. 5, is mounted to a metallic frame 20 by a mounting plate 11, the mounting plate 11 being more particularly illustrated in FIG. 6. The metallic frame 20 as is hereinafter discussed, in combination with lead wire 23 and a hermetical sealing member 19 effect a hermetical sealing terminal which in combination with lower lid 24 and upper lid 26 effects an airtight package for the quartz crystal vibrator. The vibrator's electrodes 10 are electrically coupled by a highly conductive extremely fine wire 18 to lead wire 23. Alternatively, a resilient lead plate 31, specifically illustrated in FIG. 7, could be utilized to effect the above noted electrical coupling in place of the wires 18. After the vibrator is regulated and mounted to the hermetical terminal, the lower lid 24 and the upper lid 26 are welded in a vacuum at their respective flange portions 25 and 27 to thereby provide a hermetically sealed quartz crystal vibrator assembly. A grounding pin 29 is utilized along with lead wire 23 to mechanically and electrically mount the hermetically sealed assembly in an oscillator circuit.

As is particularly illustrated in FIG. 5, vibrator 8 is formed of a sheet cut from a crystal pellet into the shape of a tuning fork. In a preferred embodiment, the vibrator would have a length C equal to 6.0 mm, a width A equal to 1.35 mm and a thickness B equal to 0.5 mm. The electrodes are preferably formed on the surface of the crystal plate by depositing Chromium and Gold on the surface and then removing same by a laser beam adapted to form the vibrator electrodes in a predetermined position. Such an electrode forming method makes it possible to obtain electrodes having a precise shape without causing any harmful effect to the quartz crystal and thereby improving the efficiency of the quartz crystal vibrator when compared with conventional electrode forming methods such as pealing off the Chromium and Gold deposited on the quartz crystal along certain dividing lines, the quartz crystal having first been shaved at the corners thereof, or having had applied thereto a paint prior to the deposition process. Further, after the Chromium and Gold are deposited on the surface of the vibrator, certain quantities of metallic or non-metallic mass elements 9 such as gold plating, solder or organic adhesives are added to the end portions of the tuning fork vibrator. The mass elements 9 effect a gradual regulation of the vibrator's frequency. A gradual removal of small amounts thereof by a laser beam, increases the frequency of the vibrator by an equally small amount, thereby providing for a fine adjustment of the frequency of the vibrator prior to hermetically sealing the package. Moreover, if the thickness B of the vibrator is equal to 1.5 mm or less, additional mass elements formed by gold plating, solder or organic adhesive are particularly effective in allowing fine adjustment of the frequency of the quartz crystal vibrator assembly.

Figure 6:
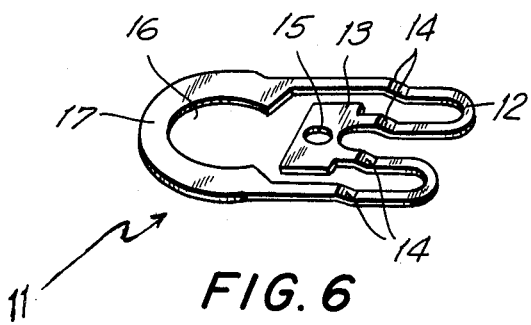
FIG. 6 is a perspective view of a mounting plate constructed in accordance with the instant invention.
Figure 7:
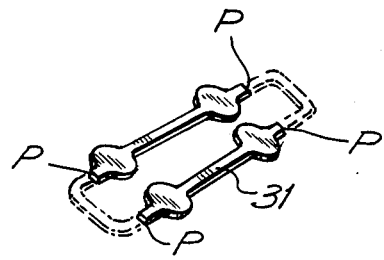
FIG. 7 is a lead plate particularly adapted for use with the hermetically sealed quartz crystal vibrator assembly illustrated in FIGS. 3 and 4.

Reference is now made to FIG. 6 wherein the mounting plate 11 which is adapted to support the vibrator 8 is more particularly illustrated. The mounting plate 11 is a flat plate formed of phosphorous bronze, berylium copper, spring steel or the like which enables the mounting plate 11 to vibrate in a direction parallel to the quartz crystal vibrator and in a direction at right angles with respect thereto. Such a mounting plate is manufactured by simple metal pressing techniques which allow same to be formed into the shape depicted in FIG. 6. If the weight of the vibrator to be mounted is considered, a vibrator such as the vibrator illustrated in FIG. 5 would require a mounting plate having a resilient portion with a width D equal to 0.2 mm and a thickness E equal to 0.15 mm, such a mounting plate allowing the vibrator to vibrate independently of any vibration or shocks received by the hermetically sealed package. Moreover, the vibratory or Q value of the assembly is maintained at high levels. Furthermore, when external shocks are applied to the vibrator, the resilient spring portion of the mounting plate vibrates in the parallel and right angle directions with respect to the vibrating direction of the vibrator thereby minimizing the shock effects thereto. Accordingly, if the shape of the mounting plate and the resiliency thereof are selected to protect the end portion of the vibrator from contacting the packaging lids and if projection 28 provides a vibration limiting device on the inside surface of the lid 26 for preventing contact of the vibrator with lid 26, the vibrator cannot be harmfully contacted by any element of the assembly and becomes shock resistant with respect to shocks applied to the assembly. The projection 28 can be formed by drawing in the surface of the upper lid or damping means can be mounted to the upper lid. Accordingly, the shape of the mounting plate 11 includes a stepwise or Z-shaped bent portion 14 which provides a gap between the vibrator plate 8 and the mounting plate 11. Because the shape of the mounting plate guarantees that the vibrator can be fixedly secured in the hermetically sealed package and cannot be harmed by shocks thereto, the mounting plate 11 is adapted to have a solder plating on the flat portion 13 to thereby mount the vibrator. Additionally, solder plating is provided on the lower surface of the mounting portion 17 of the mounting plate 11 to mount the mounting plate 11 to the metallic frame 20 of the the hermetical terminal. In order to effectively solder the vibrator to the flat portion 13 of the mounting plate 11, solder is placed on the Chromium and Gold portions deposited on the lower surface of the vibrator. Also, a mounting opening 15 is provided in the vibrator mounting portion 13 of the mounting plate 11, the opening effecting a strengthening of the manner in which the vibrator is fixed to the mounting plate.

It is noted, that since the mounting plate 11 effects an independent mounting of the vibrator to the hermetical terminal, the oscillating period of an oscillator utilizing such a hermetically sealed vibrator assembly is not affected by environmental changes such as drops in atmospheric pressure. Also, the mounting plate is adapted to be secured to the metallic frame 20, which includes annular projection 21 for securing the metallic frame to lower lid 24, and annular projection 22 for receiving mounting portion 17 thereabout.

Moreover, the flange surface formed by the metal frame annular projections define a thickness S, to thereby maintain the mounting plate 11 and vibrator 8 spaced from the upper lid 26 and lower closure member 24. Because the mounting plate 11 is mounted to the metal frame 20 by nesting the mounting portion 17 around annular projection 22 adapted to fit therein, the mounting plate is easily permanently fixed to the metallic frame. Since mounting portion 17 of the mounting plate covers the entire flange surface of the metallic frame, the stability of the vibrator is improved and furthermore, inclinations of the vibrator with respect to the package, as well as the failure to maintain the precise space therebetween can be avoided at all times. Moreover, mounting the vibrator to the mounting plate and then mounting the mounting plate 11 to the hermetical terminal provides an advantage in that no solder or organic adhesives need be placed on the vibrator but instead are utilized to mount the mounting plate to the metallic frame. It is noted that the electrodes formed on the surface of the vibrator and the lead wire of the hermetical terminals are electrically coupled by bonding the extremely fine wire 18, the only constraint being that a gap H be maintained at a greater distance than the minimum width which would cause contact between the wire and the lid 26 and hence short circuiting, or arcing therebetween. As noted above, the resilient lead plate 31 can be formed and utilized to replace the wires 18, such a plate being secured to the vibrator electrodes by means of solder or organic adhesives, and thereafter removing the portion P shown in phantom. Of course, a flat resilient securing plate would provide a more secure coupling, reduce the chances of arcing and would minimize chances of a wire breaking.

As depicted in FIGS. 3 and 4, the particular components of the quartz crystal vibrator assembly such as the vibrator 8, the mounting plate 11 and the hermetical terminal 19 are all contained in the hermetically sealed package formed by lower lid 24 and upper lid 26. Accordingly, the lower lid 24 and upper lid 26 are both formed from a thin material to thereby reduce the size of the vibrator assembly, the upper and lower lids have an oval shape as is clearly illustrated in FIG. 3, such members being formed by conventional pressing means. Both lids include peripheral flanges 25 and 27 to allow the lids to be hermetically secured by cold weld, soldering or other like techniques which allow a vacuum to be maintained in the package. Moreover, the grounding pin 29 is provided to eliminate any harmful electric fields caused by the welding and soldering. The sealed quartz crystal vibrator assembly is then mounted and electrically connected to an electric oscillator circuit by lead wire 23 of the hermetical terminal and ground pin 29 as noted above.

It is noted, that oscillator circuits utilizing a hermetically sealed quartz crystal vibrator constructed in accordance with this invention provide an extremely small-sized circuit particularly suited for use in an electronic timepiece. Moreover, because each component of the assembly can be mass produced by pressing machines, automatic lathes, etc., and further because the shapes are provided to allow same to be easily assembled, the cost of producing such an assembly is greatly lowered.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A hermetically sealed quartz crystal tuning fork vibrator assembly particularly for use as a time standard in an oscillator circuit comprising in combination a flexural mode tuning fork quartz crystal vibrator having two substantially opposed planar surfaces and being adapted to vibrate in a first vibratory direction substantially parallel to said surfaces, and a mounting plate having a first portion including a flat surface, said flat surface being secured to one of said opposed surfaces at a non-vibtatory portion of said tuning fork vibrator, said mounting plate including a second portion mounted to a reference member, said mounting plate having a resilient portion intermediate said first and second portions, said resilient portion being adapted to vibrate in said first vibratory direction at an angle of about 90° with respect to said first vibratory direction, said resilient portion being formed of two substantially U-shaped spring-like elements, a first leg of each said element being connected to said second portion and the other leg of each U-shaped spring-like elements being connected to said first portion, each leg of each element being formed with a Z-shaped bend away from said opposed surface to which said flat surface is secured so that said other leg of each U-shaped spring-like element connected to said flat surface is in overlapping relationship along the lengthwise extent of said vibrator with said opposed planar surface when said opposed planar surfaces are viewed in plan view to thereby reduce the lateral dimension of said tuning fork vibratory assembly.

2. A hermetically sealed quartz crystal vibrator assembly as claimed in claim 1, wherein said reference member includes a hermetical terminal having leads and said assembly includes means for electrically coupling said hermetical terminal leads to said vibrator, said hermetical terminal being further formed with an annular projection, said second portion of said mounting plate being shaped as a collar and adapted to be secured around said annular projection, said first leg of each of said U-shaped spring elements being connected to substantially diametrically opposed ends of said collar portion.

3. A hermetically sealed quartz crystal vibrator assembly as claimed in claim 2, wherein said electric coupling means is a resilient lead plate adapted to vibrate in both said first and second vibratory directions.

4. A hermetically sealed quartz crystal vibrator assembly as claimed in claim 3, wherein said resilient lead plate has a thickness no greater than .5 mm.

5. A hermetically sealed quartz crystal vibrator assembly as claimed in claim 2, wherein said second portion of said mounting plate is mounted to said hermetical terminal by solder plating.

6. A hermetically sealed quartz crystal vibrator assembly as claimed in claim 2 wherein said reference member further includes packaging means adapted together with said hermetical terminal to seal said vibrator and mounting plate in said package, said packaging means including a vibration limiting means positioned to engage said vibrator at an essentially non-vibratory portion thereof during large displacements of said vibrator and said first portion of said mounting plate to prevent engagement of vibratory portions of said vibrator against said lid during such displacements.

7. A hermetically sealed quartz crystal vibrator assembly as claimed in claim 6, wherein said vibration limiting means is integrally formed as an inward projection on said packaging means.

8. A hermetically sealed quartz crystal vibrator assembly as claimed in claim 6, wherein said packaging means includes an upper lid and a lower lid, said lower lid including an aperture therein, said aperture supporting said hermetical terminal, said upper and lower lid being adapted to be secured together to effect a vacuum therein.

9. A hermetically sealed quartz crystal vibrator assembly as claimed in claim 2, wherein said flat surface includes an aperture therein.

10. A hermetically sealed quartz crystal vibrator assembly as claimed in claim 1, wherein said tuning fork vibrator is respectively dimensioned to a length, width and thickness of about 6.0 mm, about 1.35 mm and about 0.5 mm.

11. A hermetically sealed quartz crystal vibrator assembly as claimed in claim 10, wherein said mounting plate is formed of one of the group of flexible metals consisting of spring steel, berylium copper, and phosphorous bronze.

* * * * *